(12) United States Patent
Wang

(10) Patent No.: US 6,573,847 B1
(45) Date of Patent: Jun. 3, 2003

(54) MULTI-TABLE MAPPING FOR HUFFMAN CODE DECODING

(75) Inventor: Wen-Shan (Vincent) Wang, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/042,778

(22) Filed: Jan. 8, 2002

(51) Int. Cl.[7] ................................................ H03M 7/40
(52) U.S. Cl. ............................................ 341/67; 341/65
(58) Field of Search ..................................... 341/65, 67

(56) References Cited

U.S. PATENT DOCUMENTS 4,899,149 A * 2/1990 Kahan ........................... 341/67
5,614,900 A * 3/1997 Watanabe ....................... 341/67
5,617,089 A * 4/1997 Kinouchi et al. .............. 341/65
6,160,918 A * 12/2000 Pigeon ......................... 382/248

FOREIGN PATENT DOCUMENTS

WO    WO 02-37687 A2 *  5/2002   ............ H03M/7/00
WO    WO 02-37687 A3 *  5/2002   ............ H03M/7/42

* cited by examiner

Primary Examiner—Howard L. Williams
(74) Attorney, Agent, or Firm—Fish & Richardson PC

(57) ABSTRACT

Unique Huffman codes are generated with each being associated with a symbol. The unique codes are grouped according to a property of the unique codes such as length. The segments of a data stream to be decoded are compared with the grouped unique codes. Each segment has the same property as the grouped unique codes being compared with.

20 Claims, 4 Drawing Sheets

| Symbol | Length (bits) | Huffman code |
|---|---|---|
| S0 | 6 | 000111 |
| S1 | 4 | 1100 |
| S2 | 5 | 00111 |
| S3 | 5 | 01000 |
| S4 | 5 | 10010 |
| S5 | 4 | 0111 |
| S6 | 5 | 10011 |
| S7 | 6 | 000110 |
| S8 | 4 | 1000 |
| S9 | 4 | 1011 |
| S10 | 6 | 001000 |

Fig. 2 (a) Original table

| Table # | | Symbol | Length (bits) | Huffman code |
|---|---|---|---|---|
| 4 | 4-1 | S5 | 4 | 0111 |
| | | S8 | 4 | 1000 |
| | 4-2 | S9 | 4 | 1011 |
| | | S1 | 4 | 1100 |
| 5 | 5-1 | S2 | 5 | 00111 |
| | | S3 | 5 | 01000 |
| | 5-2 | S4 | 5 | 10010 |
| | | S6 | 5 | 10011 |
| 6 | 6 | S7 | 6 | 000110 |
| | | S0 | 6 | 000111 |
| | | S10 | 6 | 001000 |

Fig. 2 (b) Sorted table & grouped tables

| Symbol | Length (bits) | Huffman code |
|---|---|---|
| S0 | 6 | 101010 |
| S1 | 4 | 0110 |
| S2 | 4 | 0111 |
| S3 | 4 | 1000 |
| S4 | 5 | 10010 |
| S5 | 3 | 000 |
| S6 | 5 | 10011 |
| S7 | 5 | 10100 |
| S8 | 3 | 001 |
| S9 | 3 | 010 |
| S10 | 6 | 101011 |

Fig. 3 (a) Original table

| Table # | Symbol | Length (bits) | Huffman code |
|---|---|---|---|
| 3 | S5 | 3 | 000 |
| | S8 | 3 | 001 |
| | S9 | 3 | 010 |
| 4 | S1 | 4 | 0110 |
| | S2 | 4 | 0111 |
| | S3 | 4 | 1000 |
| 5 | S4 | 5 | 10010 |
| | S6 | 5 | 10011 |
| | S7 | 5 | 10100 |
| 6 | S0 | 6 | 101010 |
| | S10 | 6 | 101011 |

Fig. 3 (b) Sorted table & grouped tables

MULTI-TABLE MAPPING FOR HUFFMAN CODE DECODING

BACKGROUND

This invention relates to multi-table mapping for Huffman code decoding.

Data compression techniques are used in many communication systems to increase the number of codes transferred within an available bandwidth, which defines the upper transfer rate of data. Huffman coding is one such compression technique used to compress and transmit, for example, video, audio/speech, and data. Each Huffman code is defined by binary digits or bits and represents a symbol such as an alphabet, a number, or other predefined information. Huffman coding is based on a variable-length statistical encoding scheme where each code's length depends on the probability of occurrence of the corresponding symbol. The more frequently appearing symbols are assigned fewer bits to optimize the transmission of information.

Huffman codes are conventionally decoded by Huffman decoding schemes such as bit-serial search and table mapping. The bit-serial search scheme processes compressed bit data serially. It requires constructing a binary tree that decodes the compressed data bit-by-bit and takes a long time to decode. Table mapping involves matching compressed bit data to predefined Huffman codes and associated symbols stored in table form. Such techniques generally require a very large storage or table size because of duplicated symbols and extra code length bits.

BRIEF DESCRIPTION OF DRAWINGS

FIG. 2(a) shows an example of a non-consecutive Huffman code set, and

FIG. 2(b) shows the Huffman code set sorted and grouped according to the codes' bit-lengths.

FIG. 3(a) shows an example of a consecutive Huffman code set, and

FIG. 3(b) shows the Huffman code set sorted and grouped according to the codes' bit-lengths.

DETAILED DESCRIPTION

A multi-table mapping Huffman decoding method can efficiently decode compressed stream data containing variable-bit length Huffman codes while reducing the need for large memory space. In an implementation, the Huffman codes, along with their associated symbols, are grouped into tables in terms of the code's bit lengths. These tables are used to decode compressed bit stream data containing Huffman codes. However, the length of any particular Huffman code in the compressed bit stream data is not known. That is, there is no predefined boundary between adjacent codes. Therefore, to decode the variable-length Huffman codes, segments of sequentially compressed bit steam data are simultaneously distributed or mapped to the tables that contain the Huffman codes that match the segment length. The Huffman codes are uniquely defined such that only one of the distributed segments matches a Huffman code in a table. When a distributed segment of a particular bit-length successfully maps to a Huffman code in a table, the corresponding symbol is identified, thereby decoding the code. Subsequent segments up to a predetermined length, whose first bit starts where the last matched segment left off, are distributed to the tables to decode the next Huffman code.

Figure 1:
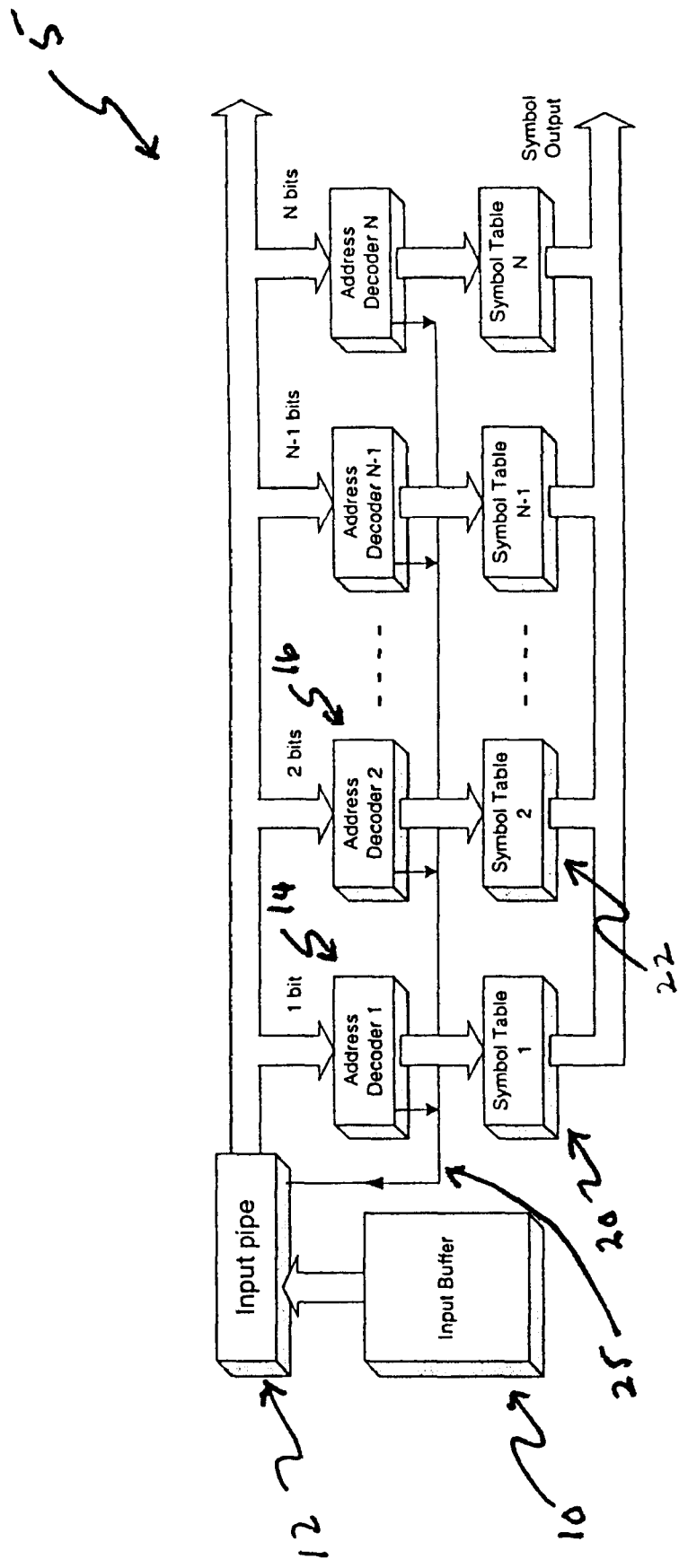
FIG. 1 shows a diagram of a multi-table Huffman decoding according to an embodiment of the invention.

FIG. 1 shows a block diagram of an example of a multi-table mapping Huffman decoder 5. Compressed input data enters an input buffer 10. The first bit of the input data are the first bit of the Huffman code. From the input buffer 10, the compressed input data is sent to an input pipe 12 from which the first n bits of the data is sent to a particular address decoder, where n is an integer from 1 to N, N being the longest input bit length to be decoded at any one time. For example, the first bit of the input data is fed into an address decoder 14; the first two bits of the input data are fed into an address decoder 16, and so forth. The output of the address decoder is a pointer to a Huffman code in a symbol table, which is explained below.

All symbols are grouped according to their corresponding Huffman code bit lengths and preloaded into symbol tables. For example, a symbol table 20 is preloaded with symbols of one-bit Huffman codes. Similarly, a symbol table 22 is preloaded with symbols of the two-bit Huffman codes. Therefore, the address decoder 14 can map an input data of one-bit length to the symbol table 20 containing the symbols of the one-bit Huffman codes, and the address decoder 16 can map an input data of two-bit length to the symbol table 22 containing the symbols of the two-bit Huffman codes, and so forth.

The coded input data of various lengths, in other words, the first one bit to the first N bits, are fed simultaneously to the corresponding address decoders but only one code is mapped successfully to a symbol because of the uniqueness of the Huffman codes. A Huffman code and its sequential segments are made unique by imputing the following characteristics: (1) all individual codes of a given Huff man code set are unique, and (2) the n most significant bits (MSB's) of a code must be different from any other code with lengthen. These characteristics are explained later in greater detail.

If an address decoder for n-bit length can map a valid symbol, the symbol is sent for further processing. Furthermore, each address decoder provides an output signal 25 to the input pipe 12 to indicate that the bit-length of the valid Huffman code is n. The signal 25 indicates to the input buffer 12 to shift out n bits of the compressed input data so that the next N-bits of the compressed input data can be processed in the same manner as described above.

Examples of Huffman code tables are given in FIGS. 2(a) and 3(a). FIG. 2(a) illustrates an example of unsorted non-consecutive Huffman codes. Huffman codes are non-consecutive if the codes of a given length cannot be ordered consecutively according to the their binary value. FIG. 3(a) is an example of unsorted consecutive Huffman codes. Every Huffman code is associated with a respective symbol, represented symbolically by "S" followed by a number. Huffman codes are consecutive if the codes of a given length can be ordered consecutively according to their binary value. The symbols can be alphabets, numbers, or other predefined representations of the user's choosing.

Figure 4:
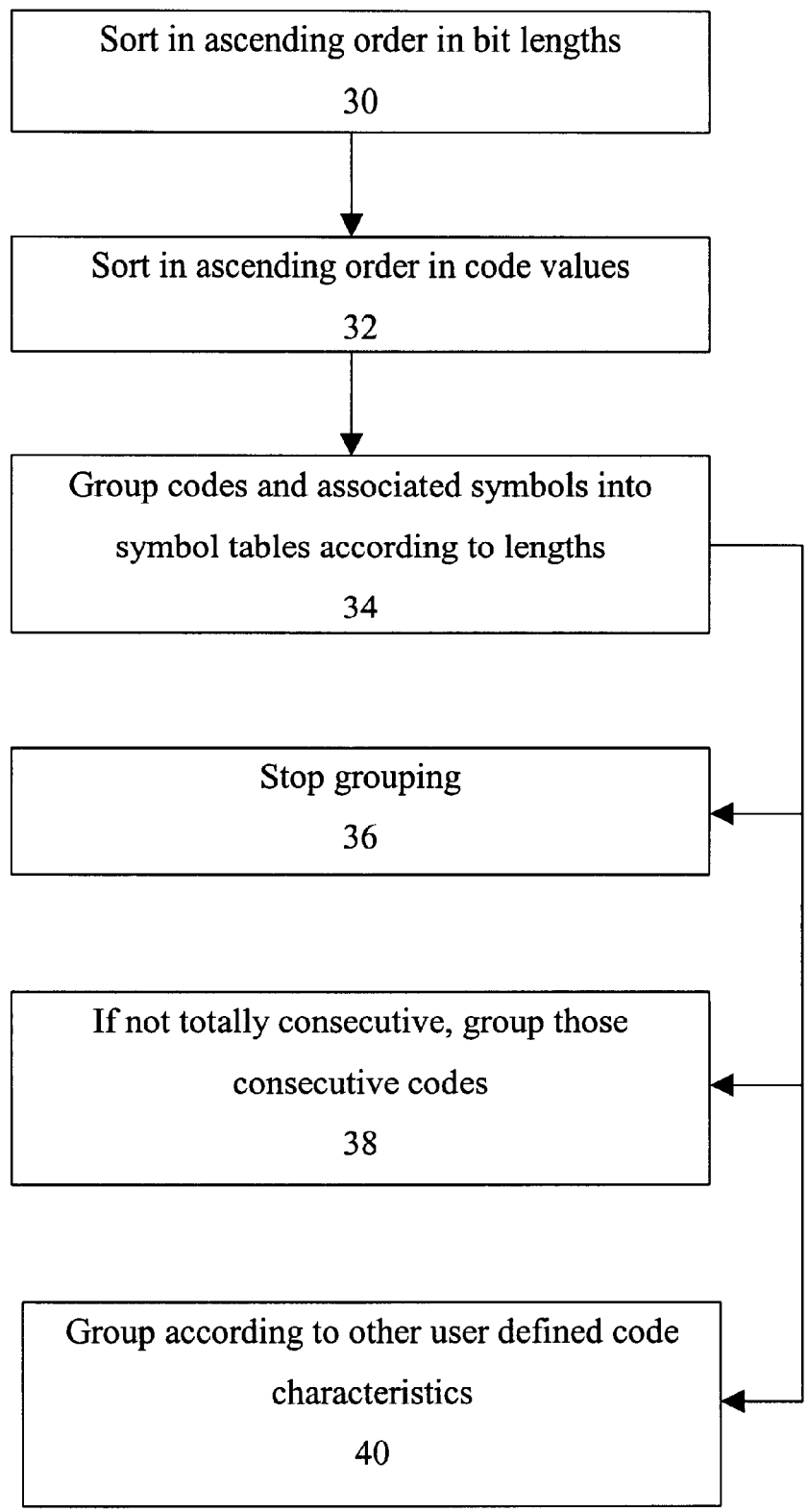
FIG. 4 shows a process of generating grouped symbol tables according to an embodiment of the invention.

An example of a process of generating grouped symbol tables is shown in FIG. 4. Huffman codes such as those in FIGS. 2(a) and 3(a) are sorted in ascending order according to the bit lengths of the codes (block 30). The codes in a given length are sorted in ascending order according to the code values, that is, the binary values of the codes (block 32). Next, the codes and the associated symbols are grouped into grouped symbol tables (block 34). The grouping process then can be stopped (block 36) for the consecutive Huffman codes. However, if some of the codes in a given grouped symbol table are not totally consecutive, those consecutive codes can be grouped further into tables (block 38). Alternatively, if possible, the codes can be grouped based on other grouping to optimize the performance (block 40).

In accordance with the process outlined in FIG. 4, the Huffman codes in FIGS. 2(b) and 3(b) have been sorted in terms of ascending code lengths and ascending code values. FIG. 2(b) shows three tables, Tables 4, 5, and 6. Tables 4 and 5 contain codes that are consecutive as well as non-consecutive. Thus, in accordance with Block 38, the codes can be subdivided further into Tables 4-1, 4-2, 5-1, and,5-2 to group consecutive codes. Huffman codes in Tables 3, 4, 5, and 6 of FIG. 3(b) have been grouped based on the code length.

Regardless of whether the Huffman codes are consecutive or non-consecutive, they satisfy the following characteristics as previously explained: (1) the individual codes of a given Huffman code set are unique, and (2) the n most significant bits (MSB's) of a code are different from any code with length n. For example, the Huffman codes in FIG. 2(b) are all unique. Furthermore, the five MSB's of the code, 001000, in FIG. 2(b) is 00100. This is different from any of the five-bit codes in the same Huffman code set (00111, 01000, 10010, 10011). The same code's four MSB's, 0010, is also different from any of the four-bit codes in the Huffman code set (0111, 1000, 1011, 1100).

Figure 5:
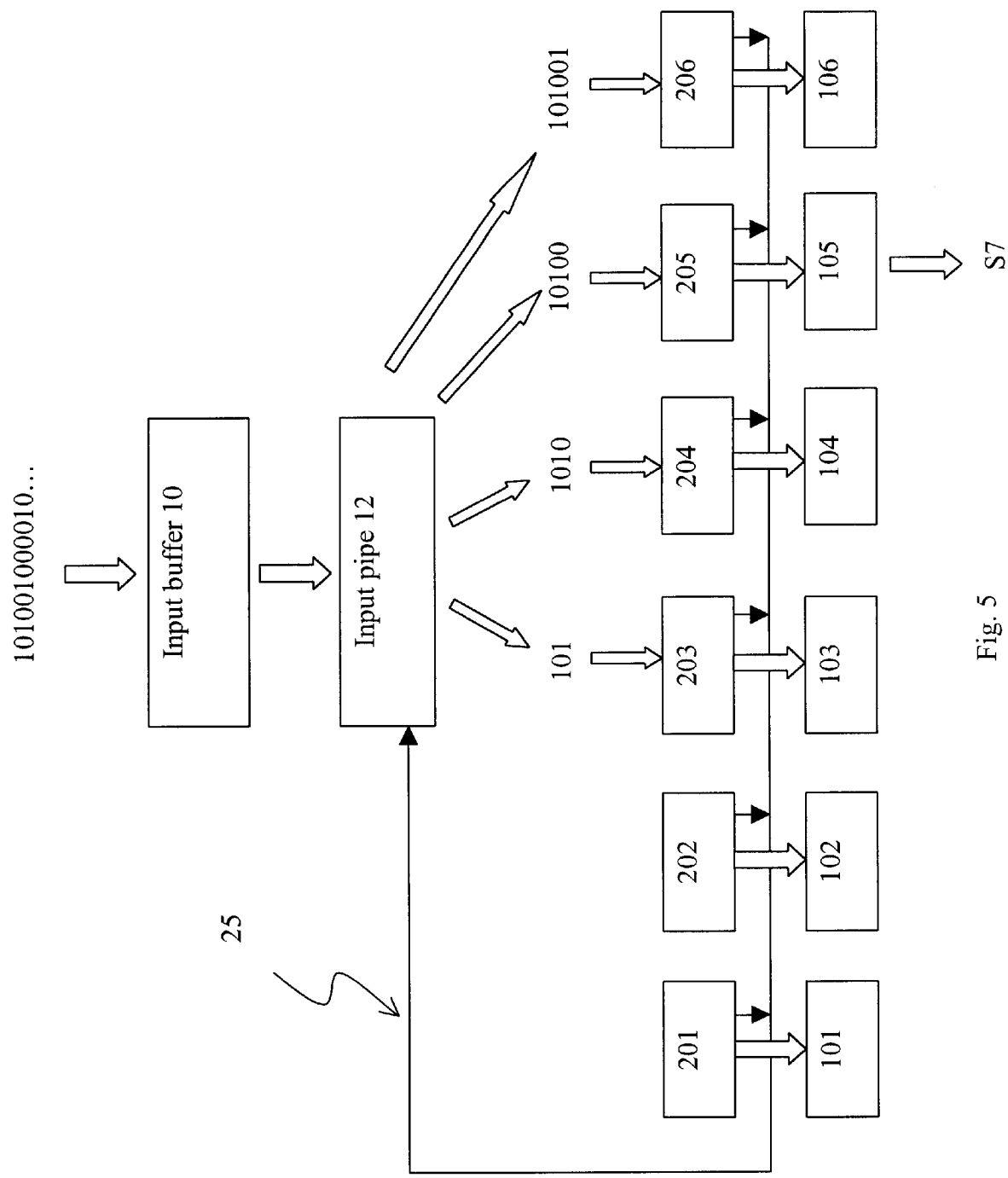
FIG. 5 shows a Huffman decoding process according to an embodiment of the invention.

By utilizing the grouped Huffman code set having the above characteristics, a stream of compressed input data can be decoded efficiently. For example, referring to FIG. 5, suppose the compressed input data, 101001000010. . . , is stored in the input buffer 10. Further suppose that the generated tables are as illustrated in FIG. 3(b). As shown in FIG. 5, Tables 3, 4, 5, and 6 are preloaded into symbol tables 103, 104, 105, and 106, respectively. That is, Table 3, which groups three bit-length codes, is loaded into the symbol table 103 and Table 4, which groups four bit-length codes, is loaded into the symbol table 104 and so forth. Symbol tables 101 and 102 are empty because there are no one-bit or two-bit Huffman codes in FIG. 3(b).

Consequently, because the longest Huffman code in the example of FIG. 3(b) is six bits, the first three bits (101), the first four bits (1010), the first five bits (10100) and the first six bits (101001) of the compressed input data are fed into address decoders 203, 204, 205, and 206, respectively, through the input pipe 12. The first bit and the first two bits are ignored because symbol tables 201 and 202 are empty. In this example, only the address decoder 205 maps the input code, 10100, to symbol S7, and thereby decoding and the first code. The address decoder 205 generates an output corresponding to the symbol, S7. The other codes cannot be mapped because the Huffman codes are undefined for those codes (see FIG. 3(b)). The address decoder 205 subsequently provides an output signal 25 to the input pipe 12 to indicate that the valid Huffman code is five bits long. The five bits of the compressed input data are shifted out from the input buffer 10 so that the next available compression coded input data becomes 1000010. . . . The process continues by feeding the first three bits (100), the first four bits (1000), the first five bits (10000), and the first six bits (100001) into the address decoders 203, 204, 205, and 206, respectively. In that case, the address decoder 204 maps the only valid input Huffman code, 1000, to S3. The four bits of the compressed input data are shifted out from the input pipe 12 and the next set of the compression coded input data shifts into the pipe for processing. The foregoing cycle can be repeated until all the compressed input data is decoded.

Various features can be implemented, for example, in a computer-readable or machine-accessible medium on a machine. The instructions can be stored on a storage medium, such as random access memory (RAM), readable by a general or special purpose machine, for decoding codes.

Other implementations are within the scope of the claims.

What is claimed is:

1. A method comprising:

receiving a data stream;

distributing segments of the data stream according to their respective lengths, each segment beginning at a same point in the data stream, and the segments ranging in length up to a maximum length;

comparing the segments to unique codes grouped according to the codes' respective lengths, each segment being compared to the unique codes having a same length as the segment; and decoding one of the segments based on the comparing.

2. The method according to claim 1 including:

identifying a particular one of the segments as matching a particular one of the unique codes; and decoding the identified segment.

3. The method according to claim 2 including:

comparing next segments of the data stream to the unique codes, each next segment beginning at a same point in the data stream immediately following the identified segment, the next segments varying in length up to the maximum length; and decoding one of the next segments based on comparing the next segments.

4. The method of claim 2 including:

comparing next segments of the data stream to the unique codes, each next segment beginning at a point immediately following the last identified segment, the next segments varying in length up to the maximum length, each next segment being compared to the unique codes having a same length as the next segment;

identifying a particular one of the next segments as matching a particular one of the unique codes;

decoding the identified next segment; and repeating said comparing next segments, identifying a particular one of the next segments and decoding the identified next segment until the data stream is decoded.

5. The method according to claim 1 wherein the unique codes are grouped into tables according to the respective lengths of the codes.

6. The method of claim 1 wherein the unique codes represent Huffman codes.

7. The method according to claim 1 wherein each segment has a bit-length that differs from the bit-length of each other segment, the segments varying sequentially in bit-length up to the maximum length.

8. An article comprising a machine-readable medium storing machine-executable instructions for causing a machine to:

compare segments of a data stream to unique codes grouped according to their respective lengths, each segment beginning at a same point in the data stream, the segments ranging in length up to a maximum length, each segment being compared to the unique codes having the same length as the segment; and decode one of the segments based on the comparing.

9. The article according to claim 8 including instruments to cause the machine to:

identify a particular one of the segments as matching a particular one of the unique codes; and decode the identified segment.

10. The article according to claim 9 including instruments to cause the machine to:

compare next segments of the data stream to the unique codes, each next segment beginning at a same point in the data stream immediately following the identified segment, the next segments varying in length up to the maximum length; and decode one of the next segments based on comparing the next segments.

11. The article according to claim 9 including instruments to cause the machine to:

compare next segments of the data stream to the unique codes, each next segment beginning at a point immediately following a last identified segment, the next segments varying in length up to the maximum length, each next segment being compared to the unique codes having a same length as the next segment;

identify a particular one of the next segnments as matching a particular one of the unique codes; and repeat said comparing next segments, identifying a particular one of the next segments and decoding the identified next segment until the data stream is decoded.

12. The article according to claim 8 wherein the unique codes are grouped into tables according to the respective lengths of the codes.

13. The article according to claim 8 wherein the unique codes represent Huffman codes.

14. The article according to claim 8 wherein each segment has a bit-length that differs from the bit-length of each other segment, the segments varying sequentially in bit-length up to the maximum length.

15. An apparatus comprising:

symbol tables each of which stores unique codes of a particular length and stores a respective symbol corresponding to each code; and address decoders each of which is coupled to a respective one of the symbol tables;

an input pipe configured to distribute segments of a data stream to the address decoders, each distributed segment having a same length as the codes in the symbol table coupled with the address decoder, each segment beginning at the same point in the data stream, and the segments ranging in length up to a maximum length.

16. The apparatus according to claim 15 wherein each address decoder is configured to:

compare the received segment to the unique codes stored in the symbol table associated with the decoder;

decode a particular one of the segments if the particular segment matches one of the unique codes based on the comparing.

17. The apparatus according to claim 16 wherein the input pipe is configured to:

distribute next segments of the data stream to the address decoders, each distributed next segment having a same length as the codes in the symbol table coupled with the address decoder, each next segment beginning at a point in the data stream immediately following the decoded segment, each next segment beginning at the same point in the data stream, and the next segments ranging in length up to a maximum length;

wherein each address decoder is configured to:

receive one of the next segments of the data stream, each next segment having a particular bit length corresponding to the length of the unique codes stored in the respective symbol table;

compare each next segment of the data stream with the unique codes stored in the symbol table associated with the decoder; and decode one of the next segments based on comparing the next segments.

18. The apparatus according to claim 15 wherein the unique codes are grouped into tables according to the respective lengths of the codes.

19. The apparatus according to claim 15 wherein each symbol table are configured to store a set of the unique codes grouped according to their lengths and grouped in sequential ascending order.

20. The apparatus according to claim 15, wherein the unique codes are Huffman codes.

* * * * *